(12) United States Patent
Coy (10) Patent No.: US 6,683,920 B1
(45) Date of Patent: Jan. 27, 2004

(54) DUAL-LOOP SYSTEM AND METHOD FOR FREQUENCY ACQUISITION AND TRACKING

(75) Inventor: Bruce H. Coy, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 677 days.

(21) Appl. No.: 09/667,264

(22) Filed: Sep. 22, 2000

(51) Int. Cl.[7] .................. H04L 27/14; H04L 27/16; H04L 27/22
(52) U.S. Cl. ..................................... 375/326
(58) Field of Search ............... 375/326, 327, 375/377, 344

(56) References Cited

U.S. PATENT DOCUMENTS

| | | | |
|---|---|---|---|
| 4,855,689 A | * 8/1989 | Kinkel | 331/17 |
| 5,025,455 A | * 6/1991 | Nguyen | 375/327 |
| 5,414,741 A | 5/1995 | Johnson | |
| 5,450,447 A | * 9/1995 | Dutta | 375/344 |
| 5,455,540 A | 10/1995 | Williams | |
| 5,471,508 A | * 11/1995 | Koslov | 375/344 |
| 5,541,965 A | 7/1996 | Daffara | |
| 5,579,345 A | * 11/1996 | Kroeger et al. | 375/344 |
| 5,592,125 A | 1/1997 | Williams | |
| 5,692,014 A | * 11/1997 | Basham et al. | 375/326 |
| 5,828,705 A | 10/1998 | Kroeger et al. | |
| 5,847,527 A | 12/1998 | Iwashiro | |
| 6,055,231 A | 4/2000 | Mesecher et al. | |
| 6,411,661 B1 | * 6/2002 | Nguyen et al. | 375/336 |
| 6,493,409 B1 | * 12/2002 | Lin et al. | 375/375 |

OTHER PUBLICATIONS

Walker, R., et al., "A 20488 Gb/s Si–Bipolar Clock and Data Recovery IC with Robust Loss of Signal Detection", Digest of Technical Papers, ISSCC97/Session/15 Serial Data Communications, Pages unknown, Publisher unknown.

Pottbäcker, Ansgar, et al., "A Si Bipolar Phase and Frequency Detector IC for Clock Extraction up to 8 Gb/s", IEEE Journal of Solid–State Circuits, Dec. 1992, pp. 1747–1751, vol. 27, No. 12, Publisher unknown.

Djahanshahi, Hormoz, et al., "Differential CMOS Circuits for 622–MHz/933–MHz Clock and Data Recovery Applications", IEEE Journal of Solid–State Circuits, Jun. 2000, pp. 847–855, vol. 35, No. 6, Publisher unknown.

* cited by examiner

Primary Examiner—Jean B. Corrielus
(74) Attorney, Agent, or Firm—Incaplaw; Terrance A. Meador (57) ABSTRACT

A dual loop system for the acquisition and tracking of a carrier signal is presented. The acquisition loop uses a bang-bang phase detector which permits the carrier to be acquired without a clock reference. Once acquired, the carrier is then tracked with a loop using a Hogge phase detector. The tracking loop is autoscaling, so that loop gain and bandwidth are responsive to the carrier signal frequency. The autoscaling feature of the tracking loop and the uniform gain of the acquisition loop permit the same loop filter to be shared by both loops. A method implementing the above-described dual-loop system is also presented.

25 Claims, 6 Drawing Sheets

DUAL-LOOP SYSTEM AND METHOD FOR FREQUENCY ACQUISITION AND TRACKING

BACKGROUND OF THE INVENTION

1. Field of the Invention

This invention relates generally to phase-locked loop circuitry and, more particularly, to a system and method of using different loops, with a shared loop filter, for the tasks of frequency acquisition and phase tracking.

2. Description of the Related Art

It is well known to acquire and track a transmitted carrier signal at a receiver through the use of frequency and phase-locked loops (PLLs) using circuit elements such as voltage controlled oscillators (VCOs), frequency dividers, frequency filters, phase detectors, and reference frequency sources. PLL design techniques using such circuit elements are discussed in Phaselock Techniques, Floyd Gardner, John Wiley & Sons, Inc., N.Y., 1966 and in Frequency Synthesis Theory and Design, Vadim Manassewitsch, John Wiley & Sons, Inc., N.Y., 1987.

Wide bandwidth loops are used in frequency acquisition. The wide bandwidth gives the loop sufficient speed to acquire a carrier signal with an unknown frequency, as the signal exists in a range of potential frequencies. However, the wide loop bandwidth also opens the loop to the noise components which are added on top of the signal generated by the VCO. A noisy oscillator signal is not always sufficient to demodulate the information carried in the transmitted signal, especially if the ratio of the transmitted signal to noise floor is small.

To remove noise from the loop, and therefore from the oscillator output signal, a narrowband loop is used. Such a loop is not responsive enough to acquire a carrier signal in a wide range of frequencies, but it is able to track a carrier signal once acquired, as long as the changes in the carrier signal are small or gradual. Therefore, it is conventional for some receivers to use a dual-loop system to acquire and track a transmitted signal.

The phase detector, oscillator, filter, and divider components all have associated gains that contribute to the overall loop gain. Conventionally, the oscillator has a gain that is constant with respect to its input frequency, and the conventional digital phase detector has a gain that varies with respect to phase. Since a frequency change in the carrier signal input to the conventional phase detector remain proportional to the frequency in the feedback path, the phase detector gain can be said to have a gain that is independent of frequency. A loop filter has a gain that is inversely proportional to frequency. While the divider does not directly affect the loop gain, a higher divisor (lower frequency) acts to decrease the loop bandwidth.

Although first-order PLL loops are unconditionally stable, their design is not always practical, as the delays associated with the divider and phase detector circuits must be factored into the loop transfer function. Hence, many loops are designed to be second-order. Such circuits are useful in tracking or frequency synthesis where the loop must selectively track frequencies within a relatively narrow band. Often the frequency divider is made variable to select the frequency. It is very desirable that such a loop work across the entire range of frequencies without having to adjust component values. Advantageously, many loop designs are autoscaling in the sense that the loop bandwidth varies in proportion to the carrier signal frequency, as the divisor ratio must be varied as the carrier signal frequency changes to supply the same oscillator signal frequency. For example, at higher carrier frequencies a smaller divisor is needed and the bandwidth is relatively large. At lower carrier frequencies the divisor is larger and the bandwidth is relatively narrow. This gain-bandwidth compensation permits the same components to be used across the entire range of frequencies.

Since second-order loops are not unconditionally stable, there can be problems in attempting to make a circuit selectable track carrier signals over a very wide range of frequencies. The above-mentioned circuit elements can be changed or modified to affect the overall loop gain. Many designers find that it is easiest to change the loop bandwidth by switching in different resistor and capacitor components of the filter. Often the filter is designed as an operational amplifier, where the amplifier gain characteristics and the feedback circuit components control the filter response. It is even more difficult to design a selectable filter so that the loop can operate wideband to acquire a signal or narrowband to track a signal.

It is well known to use a so-called bang-bang phase detector in a PLL loop. These detectors permit a loop to maintain a constant gain despite changes in the carrier signal data rate. As such, they are useful in a acquisition loop where it is desirable to have a uniform loop gain across a wide frequency range. A loop using a bang-bang detector is also useful because it can acquire a carrier signal without the use of a known reference frequency standard. However, a wideband loop using a bang-bang phase detector is not desirable for generating a narrowband, low noise signal for tracking, as it lacks the autoscaling feature, mentioned-above, which scales the loop gain bandwidth to the data rate.

It would be advantageous if a circuit could be designed, using the same loop filter to both track and acquire a carrier signal over a wide range of frequencies.

It would be advantageous if a dual-loop system could be designed using a common loop filter, one for tracking frequencies, and one for acquiring frequencies.

It would be advantageous if the above-mentioned dual-loop system were able to maintain a consistent loop gain in the acquisition mode. Further, it would be advantageous if the loop bandwidth could be scaled to the data rate of the carrier signal, once the tracking mode was selected.

SUMMARY OF THE INVENTION

Accordingly, an integrated circuit (IC) system for acquiring and tracking the frequency of a carrier signal is provided. The system comprises an acquisition loop having a fixed or constant first loop gain, independent of data rate, and a tracking loop having an autoscaling second loop gain that is responsive to the data rate of the carrier signal.

The acquisition loop includes a bang-bang phase detector, having a gain proportional to input data rate, to accept an acquisition feedback signal and a reference signal, to supply a first phase detector signal. An oscillator is connected to the bang-bang phase detector to accept the first phase detector signal. The oscillator supplies an oscillator signal with a frequency that is proportional to the voltage level. A first divider divides the oscillator signal by the first divisor to supply the first divisor quotient to the bang-bang phase detector.

In one aspect of the invention, the reference signal to the bang-bang phase detector is the carrier signal itself, so that the loop is self-acquiring. Alternately, a clock provides a clock standard signal with a predetermined frequency as the reference.

The tracking loop includes a Hogge phase detector, having a gain responsive to phase, but independent of the data rate of the input signals. The tracking lop also includes a second divisor and an oscillator. The oscillator is shared with the above-mentioned acquisition loop. A multiplexor (MUX) is connected to the output of the second phase detector and the output of the first phase detector. The MUX selects the phase detector output to be provided to the oscillator and, therefore, which loop is being operated.

A dual-loop method for acquiring and tracking a carrier signal with an IC device is also provided. The method comprises: acquiring a carrier signal with a fixed first loop gain, independent of the carrier signal data rate; and, following acquisition of the carrier signal, tracking the carrier signal with an autoscaling second loop gain that is a function of the carrier data rate.

With respect to the above-described dual-loop system, acquiring the carrier signal includes comparing the acquisition feedback signal to the carrier signal, and amplifying the resultant comparison by a bang-bang phase detector gain, which has a gain proportional to the data rates of the carrier signal. Following the acquisition of the carrier signal, the method switches from the first loop gain to the second loop gain. Likewise, tracking the carrier signal includes comparing the tracking feedback signal to the carrier signal and amplifying the resultant comparison by a Hogge phase detector gain which is independent of the carrier signal data rate.

In some aspects of the invention, the acquisition of the carrier signal is accomplished without a reference. Alternately, the method further comprises: accepting a clock standard signal having a predetermined frequency. Then, the acquisition of the carrier signal includes the reference signal as the carrier signal until acquisition occurs.

DETAILED DESCRIPTION OF THE PREFERRED EMBODIMENTS

Figure 1:
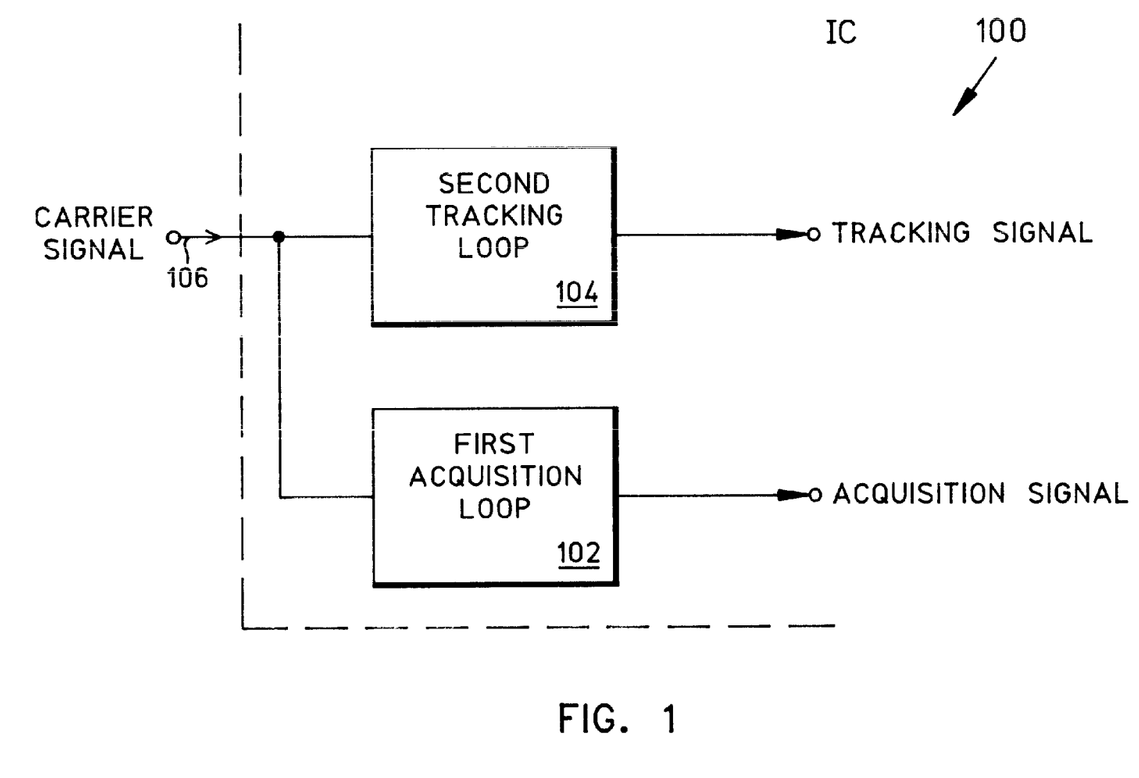
FIG. 1 is a schematic block diagram of an integrated circuit system for acquiring and tracking the frequency of a carrier signal.

FIG. 1 is a schematic block diagram of an integrated circuit (IC) system for acquiring and tracking the frequency of a carrier signal. Alternately, the invention can be embodied in a family of related ICs. The system 100 comprises an acquisition loop 102 having a fixed first loop gain, independent of the carrier signal data rate, and a tracking loop 104 having an autoscaling second loop gain that is responsive to the data rate of the carrier signal introduced on line 106.

Figure 2:
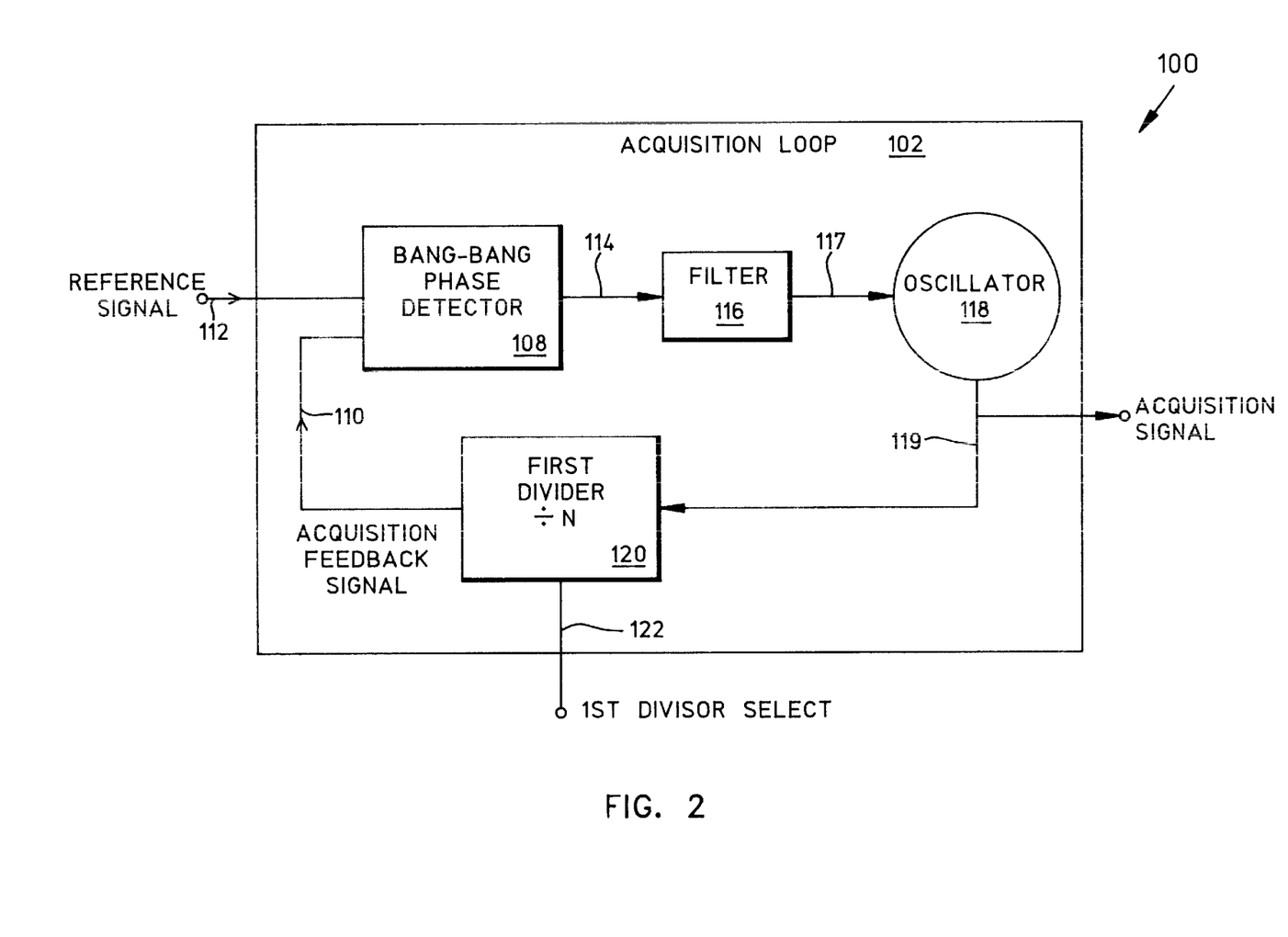
FIG. 2 is a schematic block diagram of the acquisition loop of FIG. 1 in greater detail.

FIG. 2 is a schematic block diagram of the acquisition loop 102 of FIG. 1 in greater detail. The acquisition loop includes a first phase detector 108 having a first input on line 110 to accept an acquisition feedback signal and a second input on line 112 to accept a reference signal. The first phase detector 108 compares the input signals to provide a first phase detector signal at a first output on line 114. The first phase detector has a gain that proportional to the data rate of the input signals on lines 110 and 112. The first phase detector is preferably embodied as a bang-bang phase detector.

A filter 116, having a first, low pass, filter response is connected to the output of the first phase detector on line 114 to accept the first phase detector signal. The filter 116 has an output on line 117, connected to the input of an oscillator 118, to supply the filter response. The oscillator 118 has an output on line 119 to supply an oscillator signal with a frequency that is proportional to the voltage level of the input signal on line 117.

A first divider 120 has an input on line 119 connected to the oscillator output to accept the oscillator signal. The first divider 120 provides the acquisition feedback signal at an output, connected to the first input of the first phase detector on line 110, that is the oscillator signal divided by a first divisor (N). The first divider 120 also has a first divisor select connected on line 122. The first divisor is selected so that the feedback signal to the second phase detector will be appropriate, when the tracking loop is switched. When a clock is used for acquisition, however, the first divisor is fixed number, dependent on the predetermined clock frequency.

Figure 3A:
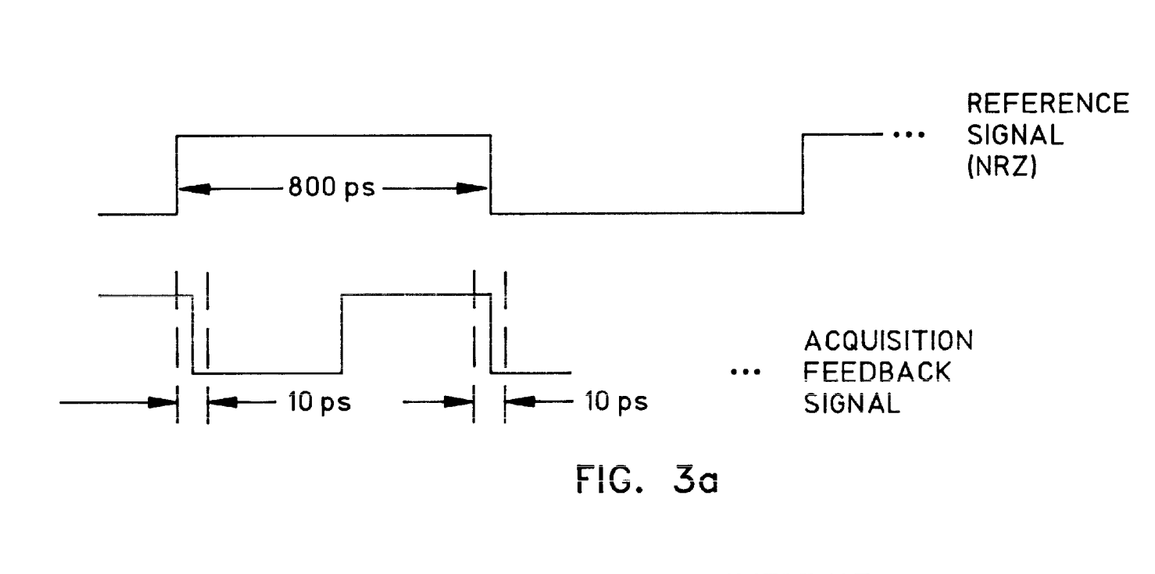
FIGS. 3a and 3b are timing diagrams illustrating characteristics of the first phase detector.
Figure 3B:
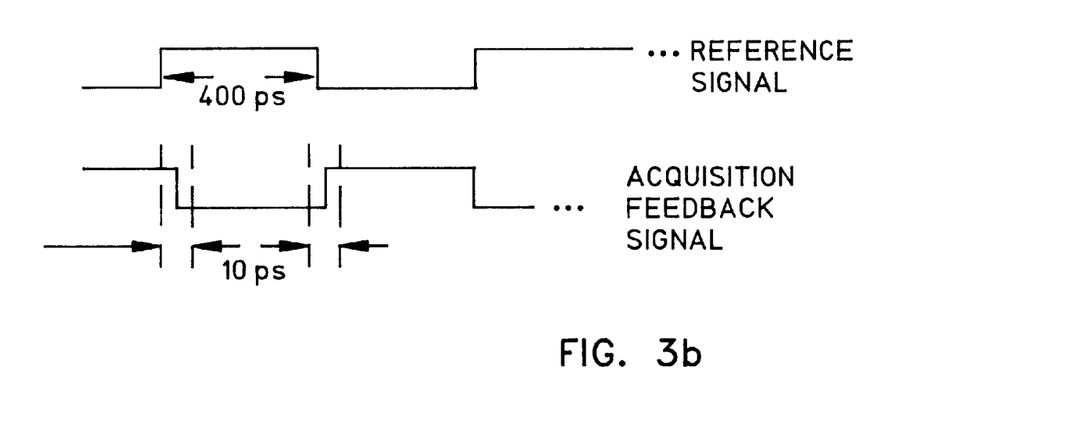

FIGS. 3a and 3b are timing diagrams illustrating characteristics of the first phase detector 108. In FIG. 3a, the frequency of the reference signal to the first phase detector, in this case the carrier signal itself, is 0.625 gigahertz (Ghz). The data rate of the non-return-to-zero (NRZ) reference signal is 1.25 gigabits per second (Gb/s). Likewise, the frequency of the acquisition feedback signal is 1.25 Ghz, assuming the first divisor is two (N=2). The gain of the first phase detector is proportional to the ratio of the reference signal period of 800 picoseconds (ps), to the active symbol period of 10 ps, which is 80. The loop gain is proportional to the phase detector gain divided by the divisor, or 80/2=40. The active symbol period is an arbitrary value dependent on the delay in the bang-bang phase detector, and remains a constant.

In FIG. 3b, the reference signal has changed to a frequency of 1.25 Ghz, with a data rate of 2.5 Gb/s. However, the acquisition feedback signal remains at 1.25 Ghz, which means the divisor must be one (N=1). The first phase detector gain is proportional to the ratio of 400 ps to 10 ps, which is 40. The loop gain, proportional to the phase detector gain divided by the divisor, is 40/1=40. Thus, the gain of the loop has remained constant despite the change in the data rate. It should be noted that the frequencies mentioned above in the description of FIGS. 3a and 3b merely illustrate a specific example of the invention. The present invention is not limited to any particular range of frequencies.

Figure 4:
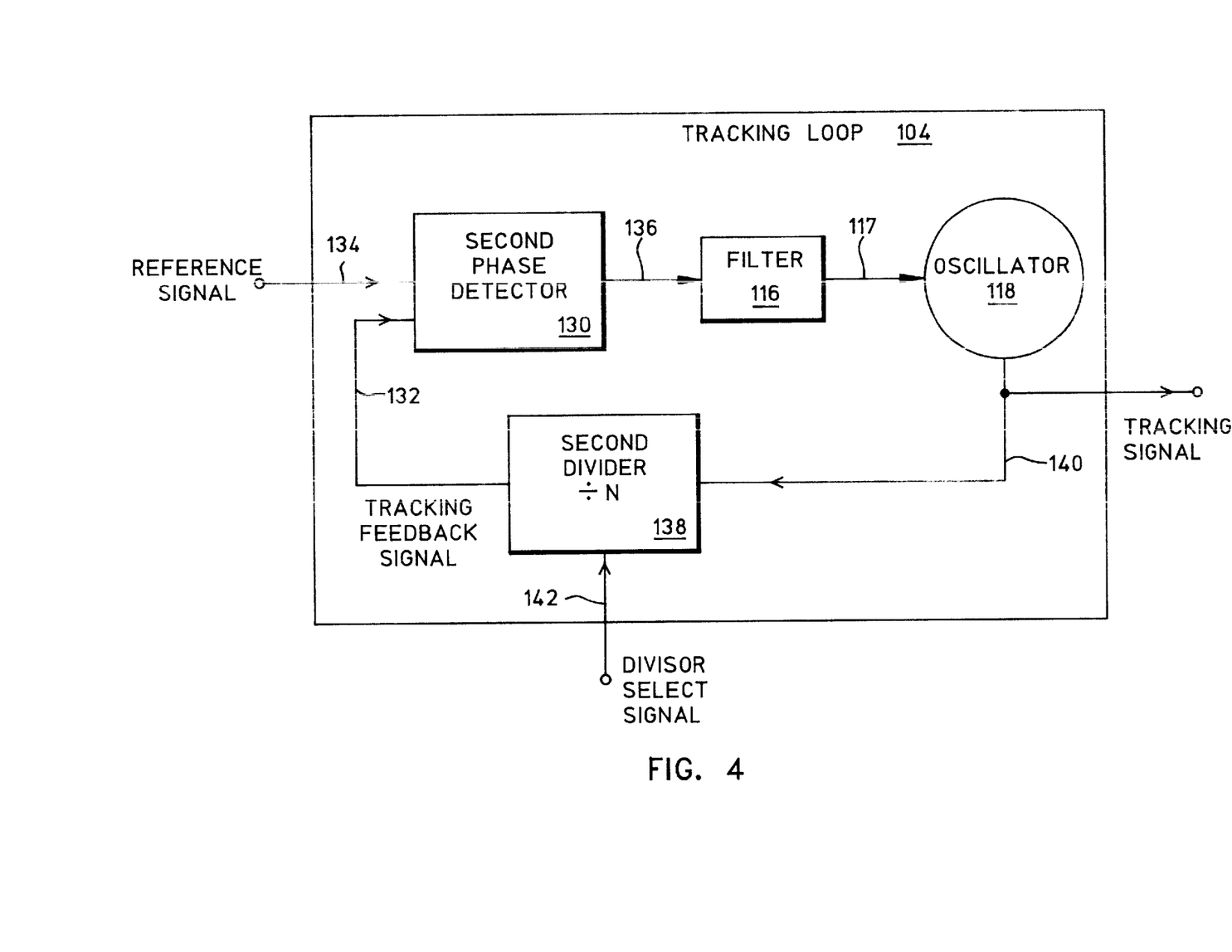
FIG. 4 is a schematic block diagram of the tracking loop of FIG. 1 in greater detail.

FIG. 4 is a schematic block diagram of the tracking loop 104 of FIG. 1 in greater detail. The tracking loop 104 includes a second phase detector 130 having a first input on line 132 to accept a tracking feedback signal and a second input on line 134 to accept a reference signal. The second phase detector 130 compares the inputs on lines 132 and 134 to provide a second phase detector signal at an output on line 136. The second phase detector 130, preferably embodied as a Hogge detector, has a gain that is proportional the phase difference between the input signals on lines 132 and 134, but independent of the data rate (frequency) of the input signals. This gain characteristic is shared by many well known digital phase detectors, and other digital phase detectors could be used in the present invention tracking loop 104. The overall tracking loop bandwidth, however, is responsive to the carrier signal data rate, as the divisor value N changes. That is, the loop bandwidth decreases as the value of N increases.

A filter 116 having an input on line 136, and a low pass filter response, is connected to the output of the second phase detector 130. In some aspects of the invention, the tracking loop 104 and the acquisition loop 102 (see FIG. 2) share the same filter 116 and oscillator 118. A second divider 138 has a first input connected to the oscillator 118 output on line 140 to accept the oscillator signal and a second input on line 142 to accept a divisor select signal. The second divider 138 provides the tracking feedback signal at an output on line 132 connected to the first input of the second phase detector 130, that is the oscillator signal on line 140 divided by the selected second divisor. Typically, the second divisor is selected from the group including 1 through 64, although the present invention is not limited to any particular divisor value.

Figure 5:
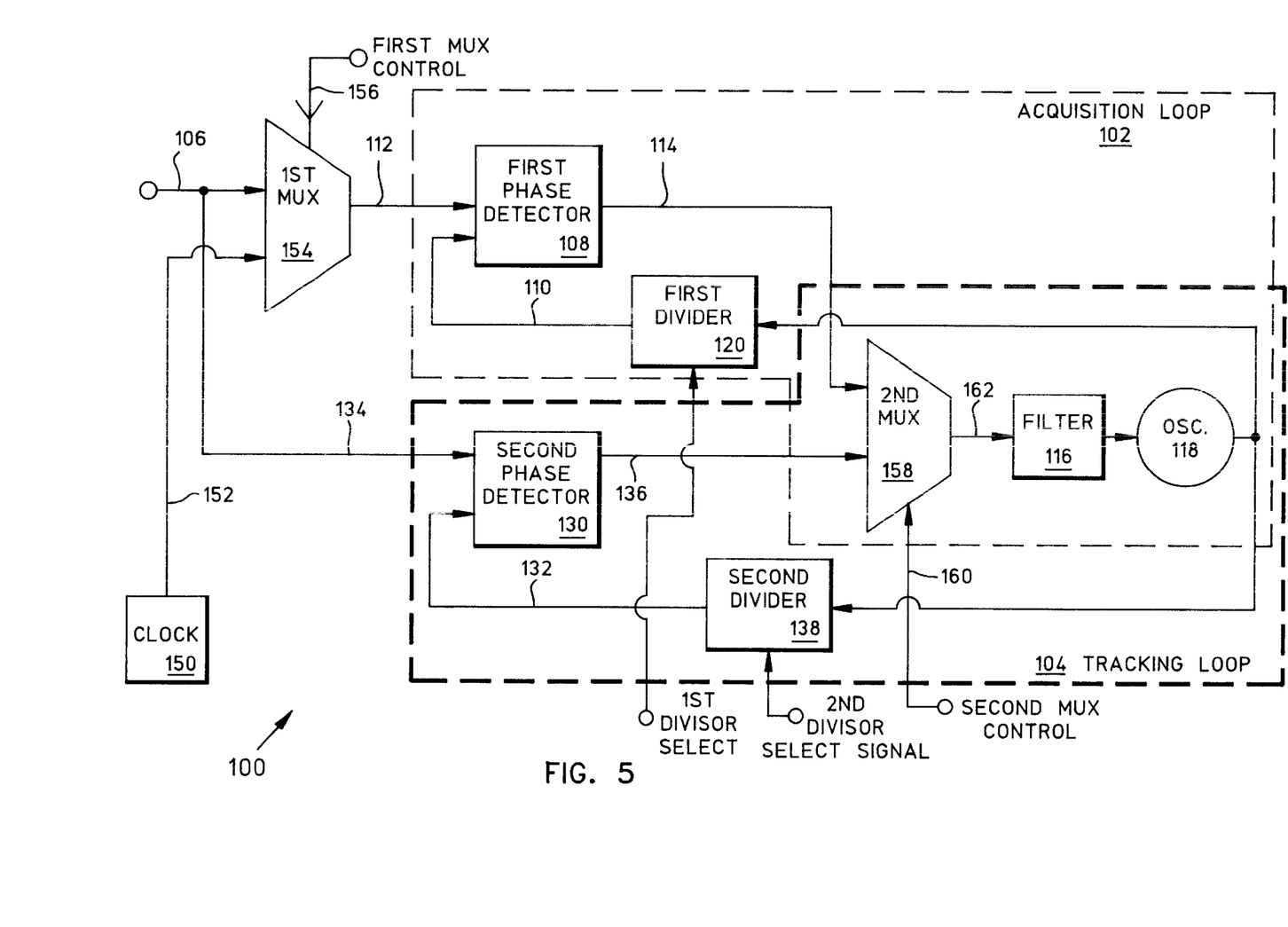
FIG. 5 is a more detailed schematic block diagram of the dual-loop system of FIG. 1.

FIG. 5 is a more detailed schematic block diagram of the dual-loop system of FIG. 1. In some aspects of the invention, the second input of the first phase detector 108, on line 112, is connected to accept the carrier signal on line 106. In this mode of operation, the system 100 takes advantage of the characteristics of the bang-bang phase detector 108 that permit the loop to be self-acquiring with respect to the carrier signal. In some aspects of the invention, the carrier signal is a digital signal that has an average data rate in the range of 30 megahertz to 2.7 gigahertz. That is, the carrier is a digital signal that has a bit density, where the changes in bit states define the above-mentioned rate. As is well understood, although the carrier is permitted to operate in this range of data rate, the carrier signal is typically operated at one specific rate while data is being transmitted. It should also be understood that the system 100 is not necessarily limited to operation in the typical range described above.

Alternately, a clock 150 having an output on line 152 supplies a clock standard signal with a predetermined frequency. A first multiplexor (MUX) 154 has a first input connected to the carrier signal on line 106, a second input connected to the output of the clock 150 to accept the clock standard signal on line 152. A control input on line 156 selects an input, and an output connected to the second input of the first phase detector on line 112 supplies the selected input. Although a clock is convenient for acquisition, it is not required. The self-acquisition feature of the present invention permit it to be used in situations where a clock is unavailable or the clock rate of the carrier is either unknown or variable.

As can be seen from FIG. 5, the acquisition and tracking loops 102/104 share the common elements of the filter 116 and the oscillator 118. A second MUX 158 has a first input connected to the output of the second phase detector 130 on line 136, a second input connected to the output of the first phase detector 108 on line 114, and a control input on line 160 to select an input. The second MUX 158 has an output on line 162 connected to the filter 116, and through the filter to the oscillator 118 input to supply the selected second MUX input. The system 100 operation is much more convenient when just a single filter and oscillator can be shared by both loops 102 and 104 without the necessity of adjusting the filter for different frequency extremes of loop bandwidths. It should be understood that although only a single oscillator 118 is depicted, oscillator 118 may be comprised of a bank of distinct oscillator circuits, where each oscillator circuit provides a narrow range of signal frequencies, and together the bank of oscillator circuits cover the entire frequency range. Although not shown, in some aspects of the invention a single divider can be shared between the two loops, just as the filter 116 and the oscillator 118 are shared.

A decision is made by a loop control circuit (not shown) to switch the mode of operation from the acquisition to the tracking mode. This decision process is enacted with the second MUX control signal on line 160.

One use of the present invention is in receivers to support SONET rates (OC-1 to OC-48). As an example of the usefulness of the invention, the system 100 of FIG. 5 will be detailed with respect to receiving SONET carrier signals, with or without using a clock as a frequency reference. Again it should be noted, however, that the invention is not limited to any particular frequency range of communication mode. One advantage of the system 100 is that a single filter 116 is used for both the acquisition and tracking loops 102/104. For final phase and frequency pulling, the tracking loop 102 gain scales with 1/N or (Kd=Vswing/2π (n)). At a bandwidth=1.7 MHz @ OC-48 rate (N=1), a peaking of only 40 mdb exists. The loop damping is proportional to $1/N^{0.5}$ and meets 0.1 db at OC-3 data rate, when N=16. Alternately stated, the damping of the closed loop is reduced by a factor of four from the OC-48 value (N=1) to OC-3 (N=16). Likewise, the bandwidth is reduced by a factor of 16 in changing from OC-48 to OC-3, as the bandwidth tracks 1/N.

When acquisition is occurring, the gain in the loop using the bang-bang phase detector 108, without additional attenuation, is 40 times greater than the tracking loop 104. Since this increased loop gain would cause a closed loop bandwidth increase above the one tenth criteria for stability during reference frequency acquisition, additional attenuation can be switched in (not shown) when the bang-bang phase detector 108 is selected. The resulting loop gain for the acquisition mode is a constant 1.5 MHz, regardless of the carrier signal data rates. In theory this allows for a data rate as low as 15 MHz.

When a carrier signal is not present on line 106, the lock detect circuitry (not shown) controlling the second MUX 158 cycles the system 100 back to the acquisition loop 102, which holds the acquisition signal on frequency. Continuous sampling of the carrier signal bit stream 106 is normal as the bang-bang phase detector responds with low frequency beat notes. Therefore, frequency excursions keep the acquisition signal within tolerance. Without a clock reference, and no data present on the carrier signal (line 106), the oscillator 118 is approximately ±20% from it's normal operation frequency.

When the clock 150 is used as a reference, the clock signal frequency is divided by eight, when a 155 MHz clock is used, and not divided, when a clock frequency of 19.44 MHz is used. In the acquisition mode the bang-bang phase detector 108, therefore, receives a reference frequency of 19.44 MHz at its second (data) input on line 112. The reference signal looks like square data at 38.88 Mb/s, with a transition density of 100 percent. The acquisition loop 102 is locked when the oscillator 118 is at a frequency of 38.88 MHz. Beat notes of the symbol edges result when phase crossings occur. The second MUX 158 switches to the tracking loop 104 for final phase alignment.

The carrier signal on line 134 is presented to the Hogge detector 130, and the second divisor in the 1/N feedback on line 132 from the oscillator 118 is selected in response to the carrier clock rate. For example, at N=4 for 622 Mb/sec OC-12 channel rate.

The carrier bit stream is typically on channel ±20 PPM, or the transmitter creating the carrier signal (not shown) has a frequency source of the same frequency accuracy system reference. In the case of a 20 PPM error between the tracking feedback signal and the reference, when final phase and frequency alignment occurs, the beat note is a constant, assuming the error is constant. If data is removed from the carrier on line 106, or the frequency of the data is pulled out of tolerance, the second MUX 158 switches to the acquisition loop 102. In the frequency acquisition mode the frequency is slewed to less than 488 PPM error. The system 100 will remain in the acquisition mode as long as the incoming data of the carrier is off tolerance.

When no clock reference signal is used, the system selects the acquisition mode and the bang-bang detector 108 to acquire the clock rate of the carrier signal on line 106 (112). The system 100 typically has knowledge of the expected clock rate so that the correct oscillator circuit is selected, when the frequency band is covered by a bank of oscillator circuits. Likewise, in the tracking mode the system 100 selects the second divider divisor in response to the expected clock rate. The bang-bang detector 108 is clocked by the acquisition feedback signal on line 110 (oscillator/N). Phase alignment must be performed with the bang-bang detector 108, as the Hogge detector 130 is tracking the data during receive operation. The Hogge detector 130 aligns the clock to the center of the symbol and the bang-bang detector 108 is "locked" without phase crossings if aligned 180 degrees with respect to the symbol. This alignment is very critical due to the tracking error which occurs for phase modulation above the loop bandwidth. The modulation rate of the jitter tolerance mask will cause a false out-of-lock condition, limiting the system's jitter tolerance if misalignment exist to the bang-bang detector 108. The modulation rate is as high as 5 MHz for OC-48. Note, the transition density of the bit stream is 50% for SONET channels and very low for HDTV patterns (20 high, 20 low). The beat notes before lock are much higher in frequencies with these data run lengths. The system 100 switches the second MUX 158 to the acquisition loop 102 when data is not present on line 106, or the oscillator 118 is out of range of the incoming bit stream.

During startup the second MUX 158 can initially select either loop 102/104. When the acquisition loop 102 is selected, the first divisor quotient (oscillator/N) to the bang-bang phase detector 108 is slewed until the beat note period is long enough. Then, the second MUX 158 switches to the tracking loop 104 for data final frequency and phase alignment. The transfer from the bang-bang detector 108 is critical due to the limited frequency pull range of the Hogge detector 130. The Hogge detector 130 only tracks for approximately 1000 PPM frequency excursions from a locked steady state of the bit stream. If the frequency change is greater than 1000 PPM, the tracking will be discontinuous and loop 104 will float off frequency causing beat notes that switch the second MUX 158 back to the acquisition mode. If no data is present on line 106, this cycle of acquisition is continuous. If the tracking loop 104 is selected at startup, the detector 130 again has very limited frequency pulling capability, and the system 100 is forced to select the acquisition loop 102.

Figure 6:
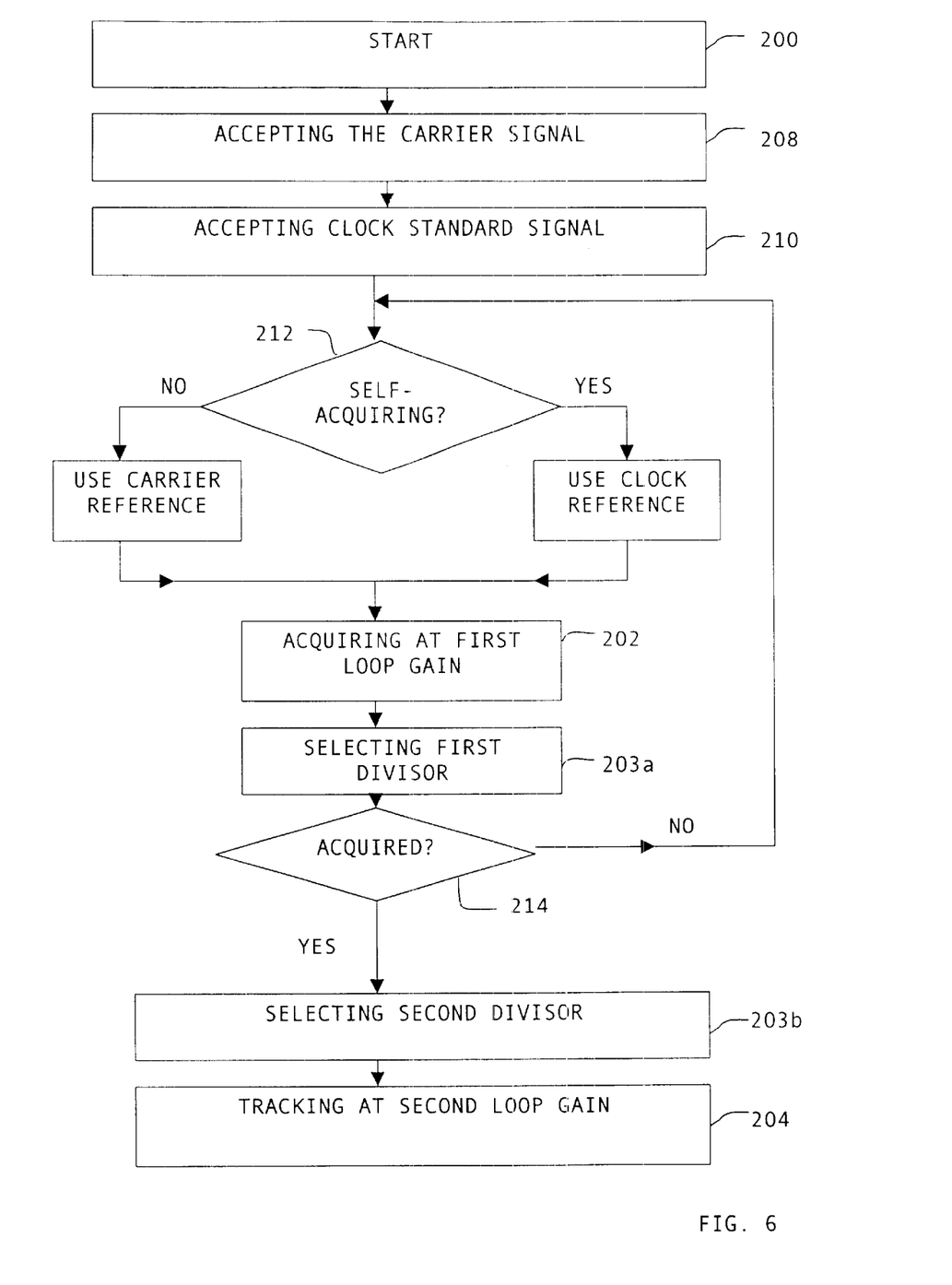
FIG. 6 is a flowchart illustrating a dual-loop method for acquiring and tracking a carrier signal with an IC circuit.

FIG. 6 is a flowchart illustrating a dual-loop method for acquiring and tracking a carrier signal with an IC circuit. Although the method is depicted as a sequence of numbered steps for clarity, no inference should be made with respect to the ordering of the steps unless explicitly stated. The method begins at Step 200. Step 202 acquires a carrier signal with a fixed first loop gain, independent of the carrier signal data rate. In some aspects of the invention, acquiring a carrier signal in Step 202 includes acquiring a carrier signal having a data rate in the range from 30 megahertz to 2.7 gigahertz. Following acquisition of the carrier signal in Step 202, Step 204 tracks the carrier signal with an autoscaling second loop gain that is a function of the carrier signal data rate.

Acquiring the carrier signal in Step 202 includes generating an oscillator signal and dividing the oscillator signal with a first divider to yield an acquisition feedback signal. In some aspects of the invention, acquiring a carrier signal in Step 202 includes dividing the oscillator signal with a selectable divisor. Further, acquiring the carrier signal in Step 202 includes comparing the acquisition feedback signal input to a reference signal input and amplifying the resultant comparison to supply a first phase detector signal having a gain that is proportional to the data rates of the input signals. In some aspects, acquiring the carrier signal in Step 202 includes using a bang-bang phase detector to compare inputs, amplify the results, and supply the first phase detector signal. In some aspects of the invention, Step 202 includes a first filter response being used to filter the phase detector gain.

Tracking the carrier signal in Step 204 includes generating an oscillator signal and dividing the oscillator signal with a selectable second divider to yield a tracking feedback signal. Further, tracking the carrier signal in Step 204 includes comparing the tracking feedback signal input to the reference signal input and amplifying the resultant comparison to supply a second phase detector signal having a gain that is independent of the data rates of the inputs. In some aspects, supplying a second phase detector gain in Step 204 includes using a Hogge phase detector. In some aspects, Step 204 includes the second phase detector gain being filtered with the first filter response (the same filter response used for acquisition in Step 202).

Some aspects of the invention include further steps. Step 208 accepts the carrier signal. Then, the acquisition of the carrier signal in Step 202 can include the reference signal being the carrier signal accepted in Step 208. Alternately, Step 210 accepts a clock standard signal having a predetermined frequency, and the acquisition of the carrier signal in Step 202 includes the reference signal being the clock standard signal. The decision block 212 represents the process of deciding whether the carrier or the clock signal is to be used as the reference in the acquisition process.

Following the acquisition of the carrier signal, Step 214 switches from the first loop gain to the second loop gain. Step 214 is represented as a decision block which switches between the acquisition and tracking modes of operation. Step 203a selects the first divisor, and Step 203b selects a second divisor in response to the carrier signal data rate. In some aspects of the invention, Step 203 includes selecting divisors in the range from 1 to 64, although the method is not limited to any particular value of first or second divisor.

A dual-loop, acquisition and tracking, system and method have been presented. The system advantageously uses the same oscillator and filter for both loops. The parts sharing between loops is made possible because of the fact that the tracking loop is designed to be autoscaling, so that the same filter can be used at all frequencies of operation, while the acquisition loop gain remains constant at all frequencies. The use of the system is presented in the context of a SONET receiver, as an example. However, the invention is not limited to just this use. Other variations and embodiments of the invention will occur to those skilled in the art.

I claim:

1. In an integrated circuit, a dual-loop method for acquiring and tracking the carrier signal, the method comprising:
   acquiring a carrier signal with a fixed first loop gain independent of a carrier signal data rate; and
   following acquisition of the carrier signal, tracking the carrier signal with an autoscaling second loop gain that is a function of the carrier signal data rate.

2. The method of claim 1 wherein acquiring the carrier signal includes generating an oscillator signal in response to a reference signal and dividing the oscillator signal with a first divider to yield an acquisition feedback signal; and
   wherein acquiring the carrier signal includes comparing the acquisition feedback signal and the reference signal and amplifying the resultant comparison to yield a first phase detector signal having a gain that is proportional to a data rate of acquisition feedback signal and the reference signal.

3. The method of claim 2 wherein tracking the carrier signal includes generating an oscillator signal in response to the reference signal and dividing the oscillator signal with a second divider to yield a tracking feedback signal; and
   wherein tracking the carrier signal includes comparing the tracking feedback signal and the reference signal and amplifying the resultant comparison to yield a second phase detector signal having a gain that is independent of a data rate of the tracking feedback signal and the reference signal.

4. The method of claim 3 further comprising:
   accepting the carrier signal; and
   wherein the acquisition of the carrier signal includes the reference signal being the carrier signal.

5. The method of claim 3 further comprising:
   accepting a clock standard signal having a predetermined frequency; and
   wherein the acquisition of the carrier signal includes the reference signal being the clock standard signal.

6. The method of claim 3 wherein acquiring the carrier signal includes filtering the first phase detector signal with a first filter response; and
   in which tracking the carrier signal includes filtering the second phase detector signal with the first filter response.

7. The method of claim 1 further comprising:
   following the acquisition of the carrier signal, switching from the first loop gain to the second loop gain.

8. The method of claim 3 further comprising:
   selecting the first and second divisors in response to the data rate of the carrier signal.

9. The method of claim 1 wherein acquiring a carrier signal includes acquiring a carrier signal having a data rate in the range from 30 megahertz to 2.7 gigahertz.

10. The method of claim 3 wherein tracking the carrier signal includes selecting first and second divisors in the range from 1 to 64.

11. The method of claim 2 wherein acquiring the carrier signal includes using a bang-bang phase detector to supply the first phase detector signal.

12. The method of claim 3 wherein tracking the carrier signal includes using a Hogge phase detector to supply the second phase detector signal.

13. In an integrated circuit, a self-acquisition method for tracking a carrier signal, the method comprising:
   accepting a carrier signal;
   using the carrier signal as reference, acquiring the input signal with a first loop having a fixed first loop gain independent of the carrier signal data rate; and
   using the carrier signal as a reference, tracking the carrier signal with an autoscaling second loop having a second loop gain that is responsive to of the carrier signal.

14. In an integrated circuit, a system for acquiring and tracking the frequency of a carrier signal, the system comprising:
   an acquisition loop having a fixed first loop gain independent of the carrier signal data rate; and
   a tracking loop having an autoscaling second loop gain that is responsive to the date rate of the carrier signal.

15. The system of claim 14 in which the acquisition loop includes:
   a first phase detector having a gain proportional to the data rate of the input signals, the first phase detector having a first input to accept an acquisition feedback signal, a second input to accept a reference signal, and an output to supply a first phase detector signal.

16. The system of claim 15 in which the acquisition loop includes:
   a filter with an input connected to the first phase detector output and a first filter response at an output;
   an oscillator having an input connected to the output of the filter to accept the first filter response, the oscillator having an output to supply an oscillator signal with a frequency that is proportional to the voltage level of the input signal; and
   a first divider having a first input connected to the oscillator output to divide the oscillator signal by a first divisor and a second input to select the first divisor, the first divider providing the acquisition feedback signal at an output connected to the first input of the first phase detector.

17. The system of claim 16 wherein the second input of the first phase detector is connected to accept the carrier signal.

18. The system of claim 17 further comprising:
   a clock having an output to provide a clock standard signal with a predetermined frequency; and
   a first multiplexor (MUX) having a first input connected to the carrier signal, a second input connected to the output of the clock to accept the clock standard signal, a control input to select an input, and an output connected to the second input of the first phase detector to provide the selected input.

19. The system of claim 18 wherein the tracking loop includes:
   a second phase detector having a first input to accept the tracking feedback signal and a second input to accept the reference signal, the second phase detector comparing the inputs and amplifying the resultant comparison to provide a second phase detector signal at an output with a gain that is independent of a data rate of the input signals.

20. The system of claim 19 wherein the tracking loop further includes:
   a second divider having a first input connected to the oscillator output to divide the oscillator signal by a second divisor and a second input to accept a divisor select signal, the second divider supplying the tracking feedback signal at an output connected to the first input of the second phase detector.

21. The system of claim 20 further comprising:
a second MUX having a first input connected to the output of the second phase detector, a second input connected to the output of the first phase detector, a control input to select an input, and an output connected to the filter input to provide the selected input.

22. The system of claim 20 wherein the first and second dividers have selectable first and second divisors, respectively, in the range between 1 and 64.

23. The system of claim 22 wherein the oscillator supplies an oscillator signal with a frequency in the range from 30 megahertz to 2.7 gigahertz.

24. The system of claim 19 wherein the second phase detector is a Hogge phase detector.

25. The system of claim 15 wherein the first phase detector is a bang-bang phase detector.

* * * * *